United States Patent [19]
Arai et al.

[11] Patent Number: 6,040,985
[45] Date of Patent: Mar. 21, 2000

[54] CIRCUIT BOARD HAVING GENERAL PURPOSE REGION AND PROGRAMMABLE REGION

[75] Inventors: Masayuki Arai, Tokyo; Seiji Kobayashi, Kanagawa, both of Japan

[73] Assignee: Sony Corporation, Japan

[21] Appl. No.: 08/955,495

[22] Filed: Oct. 22, 1997

[30] Foreign Application Priority Data

Oct. 23, 1996 [JP] Japan .................................. P08-299365

[51] Int. Cl.[7] ............................................. H05K 7/06
[52] U.S. Cl. ..................... 361/780; 361/748; 361/760; 361/777; 361/794; 174/255; 174/261; 174/262; 257/723
[58] Field of Search ......................... 29/830, 832, 846, 29/847; 174/262, 250, 255, 260, 261; 228/180.21, 180.22; 257/209, 208, 528, 529, 530, 665, 691, 692, 700, 701, 723, 724, 786; 361/748, 760, 764, 772, 774, 775, 777, 778, 780, 805, 806, 794; 438/600, 601, 612, 613, 666, 108, 131, 132; 439/68, 69, 516; 333/246, 247

[56] References Cited

U.S. PATENT DOCUMENTS

4,560,962  12/1985  Barrow ....................................... 174/255

FOREIGN PATENT DOCUMENTS

0419232  3/1991  European Pat. Off. ................ 361/777

*Primary Examiner*—Leo P. Picard
*Assistant Examiner*—John B. Vigushin
*Attorney, Agent, or Firm*—Rader, Fishman & Grauer; Ronald P. Kananen

[57] ABSTRACT

A circuit board including a general-purpose region for mounting a general-purpose electrical part, and a programmable region for mounting a programmable digital electrical part, the general-purpose region and the programmable region being provided on the same board. The circuit board may comprise at least four layers of a first wiring pattern layer, a second wiring pattern layer, a power source layer provided between the first and second wiring pattern layers, and a ground layer provided between the first and second wiring pattern layer.

6 Claims, 11 Drawing Sheets

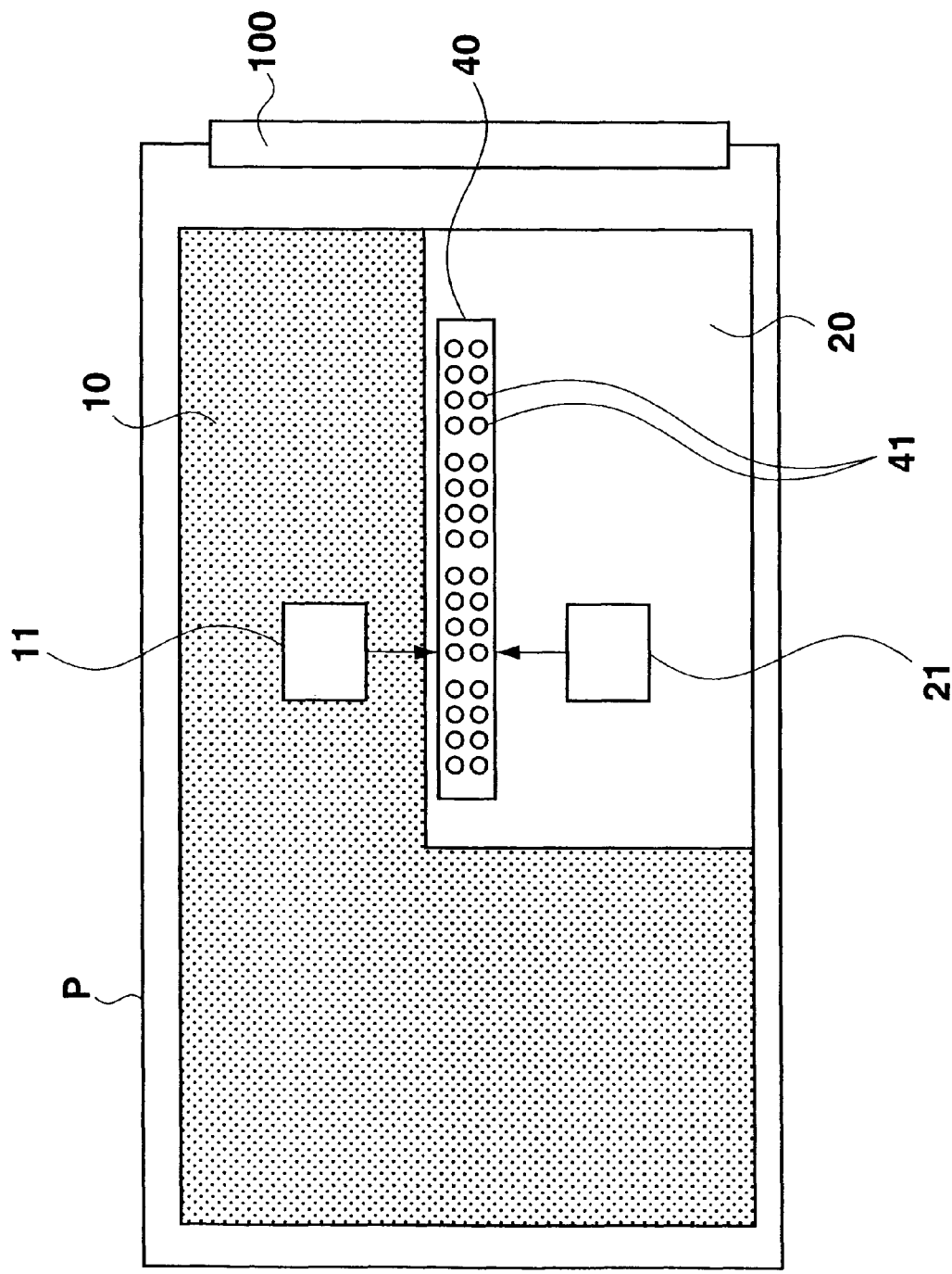

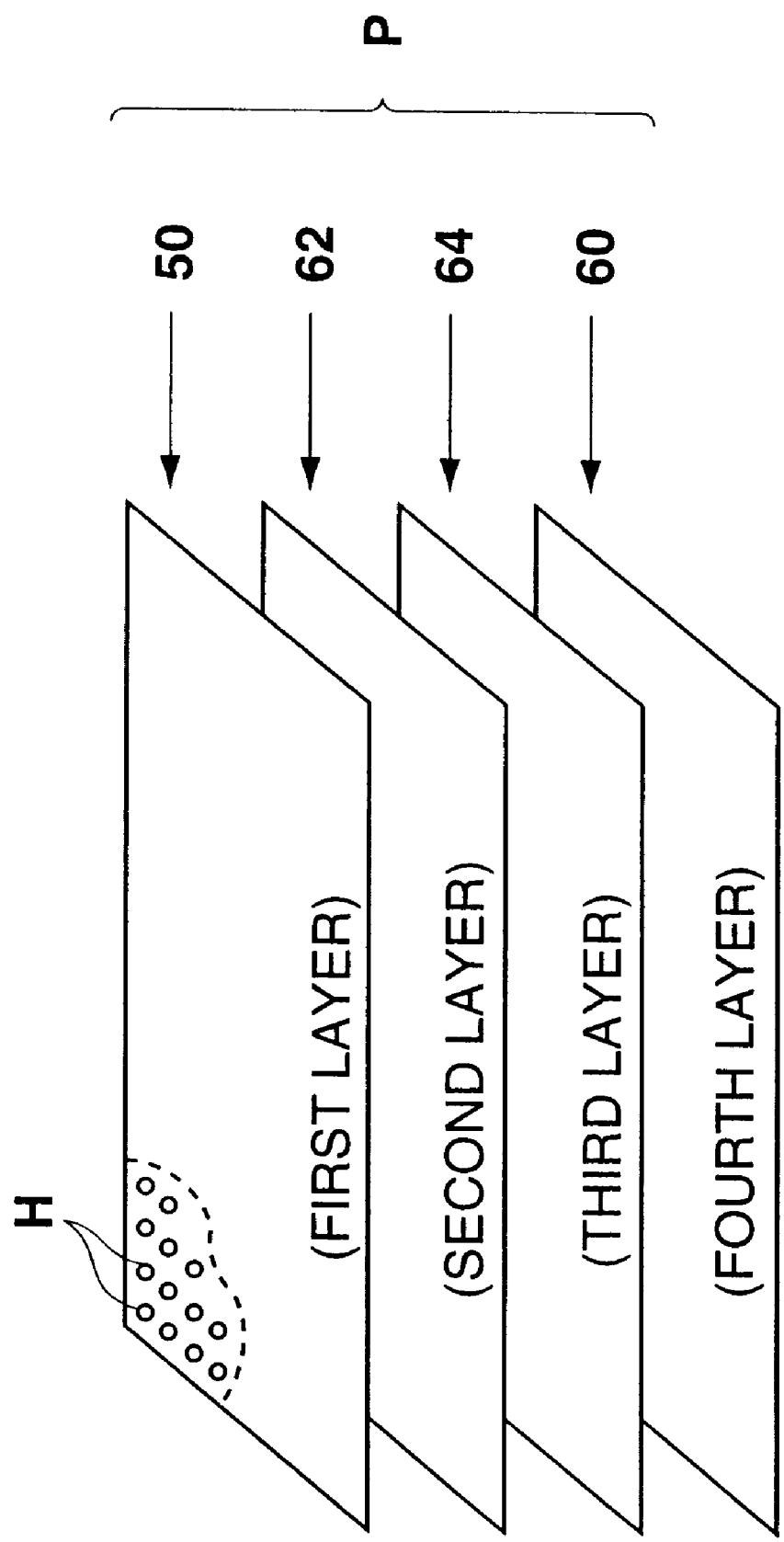

CIRCUIT BOARD HAVING GENERAL PURPOSE REGION AND PROGRAMMABLE REGION

BACKGROUND OF THE INVENTION

1. Field of the Invention

The present invention relates to a circuit board containing a general-purpose region for mounting therein a general-purpose electrical part, a programmable region for mounting therein a programmable digital electrical part which are provided on the same board.

2. Description of Related Art

A print circuit board is used as a board for an electrical circuit. The print circuit board is formed by etching a wiring pattern of an electrical circuit which is designed in advance. For example, as the print circuit board are known a microcomputer mounting board which is installed in electrical equipment, an I/O board to be inserted into a blank slot of a computer, etc. Wires are formed as metal lines on these boards by etching, and thus it is difficult to change a connection pattern.

Further, as another electric circuit board is known a general-purpose board called as "universal board" which has holes formed in a grid pattern over the surface thereof. By using this board, wiring can be freely performed on a designed electric circuit even if it is any one of an analog circuit and a digital circuit. The pattern of this board can be relatively easily changed, however, mass production cannot be performed.

Still further, recently, great advances of semiconductor technologies enable high integration of transistors, and an electric part such as a programmable logic device which can program various circuits by using one chip is used for an electronic circuit. By using this device, the central circuit can be programmed. Therefore, the connection may be changed in the device without changing a wiring pattern of the print board, and the function thereof can be changed.

The print board on which a normal connection pattern is wired is suitable for mass production, however, it is difficult to change the circuit design. Further, the universal board has high degree of freedom in the circuit design. However, when an electronic circuit thus formed is required to be copied, the copied circuit may not be provided with the same circuit characteristic or wiring may fail because it is performed by a manual work. Accordingly, the electronic circuit using the universal board is unsuitable for the mass production.

Further, with respect to the general-purpose digital board on which a programmable logic device, etc. are mounted, the change of the function of the digital circuit and the change of the circuit can be easily performed by software, so that the failure of the manual work such as the failure of soldering due to these changes can be prevented. However, this board cannot be added with an analog circuit which is inherent to a user.

There is known a digital circuit board which is added with an analog circuit region in advance. However, in some cases the analog circuit cannot be operated well due to the effect of noises from the digital circuit. The analog circuit often needs plural power source voltages (for example, +5V, −5V) to operate, and it is difficult to supply plural power sources.

Further, a high-performance programmable logic device has a small pin interval, and thus it cannot use the conventional universal board which has 0.1-inch-interval holes. Therefore, when a programmable logic device is mounted, a novel board therefor must be provided every time.

SUMMARY OF THE INVENTION

An object of the present invention is to provide a circuit board containing a general-purpose region for mounting general-purpose electric parts and a programmable region for mounting programmable digital electric parts which are provided on the same board.

According to the present invention, a general-purpose electrical part (for example, a digital electrical part, an analog electrical part) is mounted in the general-purpose region. Further, a programmable digital part such as a programmable logic device (PLD) or the like is mounted in the programmable region.

The PLD is formed of one chip, and it is a digital electric part which can program various digital circuits.

The general-purpose region and the programmable region are provided on the same board, and both the general-purpose electric part and the programmable digital electric part can be mounted on the circuit board as a so-called general-purpose circuit board, and the general versatility in the circuit design can be enhanced.

Further, plural power sources are provided in the general-purpose region in advance, so that an analog IC, etc. which need plural power sources can be used with no problem.

BRIEF DESCRIPTION OF THE DRAWINGS

FIG. 1 is a plan view showing a first embodiment of a circuit board according to the present invention;

FIG. 3 is a diagram showing a laminate structure of the circuit board according to the present invention;

DETAILED DESCRIPTION OF THE PREFERRED EMBODIMENT

Figure 2A:
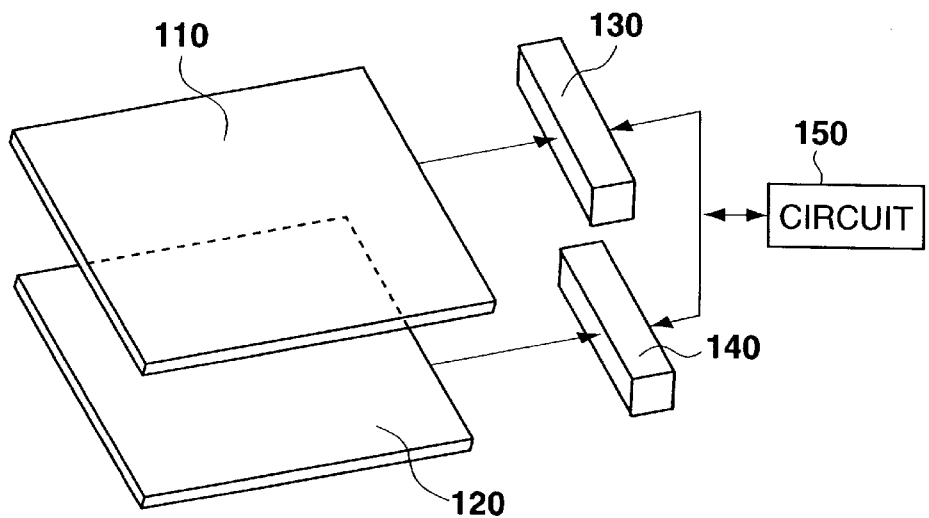
FIGS. 2A and 2B are diagrams showing a conventional circuit board and a circuit board according to the present invention.

A preferred embodiment according to the present invention will be described with reference to the accompanying drawings.

The following embodiment is a preferable embodiment according to the present invention, and the present invention is not limited to this embodiment unless the limitation of the present invention is clearly described.

FIG. 1 is a conceptual diagram showing an embodiment of a circuit board according to the present invention.

A circuit board P includes a general-purpose region 10, a programmable region 20, a connector 100, etc. The general-purpose region 10 and the programmable region 20 are formed and arranged on the same board.

A general-purpose electric part 11 such as a general-purpose analog electrical part, a general-purpose digital electric part or the like can be mounted on the general-purpose region 10. Further, a programmable digital electric part 21 such as a programmable logic device (PLD), a field programmable gate array (FPGA) or the like can be mainly mounted on the programmable region 20.

The general-purpose electrical part 11 and the programmable digital electrical part 21 can receive and transmit signals through an assembly 40 of I/O through holes (input/output through holes) which are used as interface means. The through hole assembly 40 is provided with plural or many input/output through holes 41.

The general-purpose electric part 11 mounted on the general-purpose region 10 and the programmable digital electric part 21 mounted on the programmable region 20 receive/transmit signals from/to the external of the circuit board P through the connector 100.

Figure 2B:
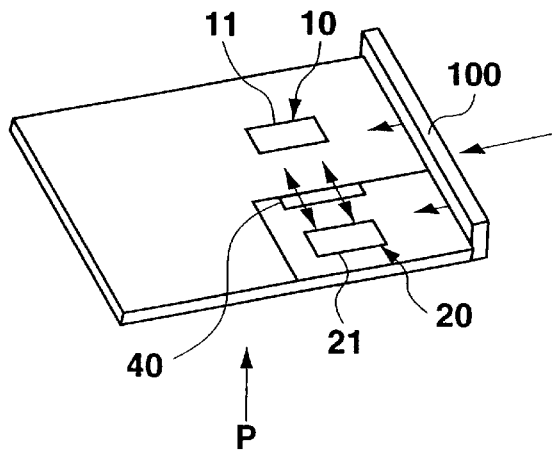

FIG. 2A shows a conventional connection manner between a general-purpose circuit board and a programmable circuit board, and FIG. 2B schematically shows the circuit board P of the present invention shown in FIG. 1. With respect to the board shown in FIG. 2A which has been hitherto used, a general-purpose circuit board 110 and a programmable circuit board 120 are electrically connected to each other through connectors 130 and 140. Signals are supplied from an external circuit 150 to the digital circuit board 120 and the general-purpose circuit board 110, and conversely the signals are transmitted from the circuit boards 110 and 120 to the external circuit 150 through the connectors 130 and 140.

On the other hand, with respect to the circuit board P, the general-purpose region 10 and the programmable region 20 are integrally provided on one board, and the connector 100 is set for these regions. The digital electric part 21 at the programmable region 20 side and the general-purpose electric part 11 at the general-purpose region 10 side can deliver signals to each other through the through hole assembly 40 serving as interface means. Accordingly, the number of connection pins of the connector 100 can be reduced.

FIG. 3 conceptually shows the laminate structure of the circuit board P according to the present invention. The circuit board P comprises totally four layers of a first wiring pattern layer (called as a part face) 50, a second wiring pattern layer (called as a soldering face) 60, a power source layer 62 and a ground layer (GND layer) 64. These layers are laminated so that the pattern layer 50 serves as a first layer, the power source layer 62 serves as a second layer, the ground layer 64 serves as a third layer and the second wiring pattern layer 60 serves as a fourth layer. A pattern is formed in the circuit board P so that the through holes H are arranged in a grid pattern as partially shown.

Figure 4:
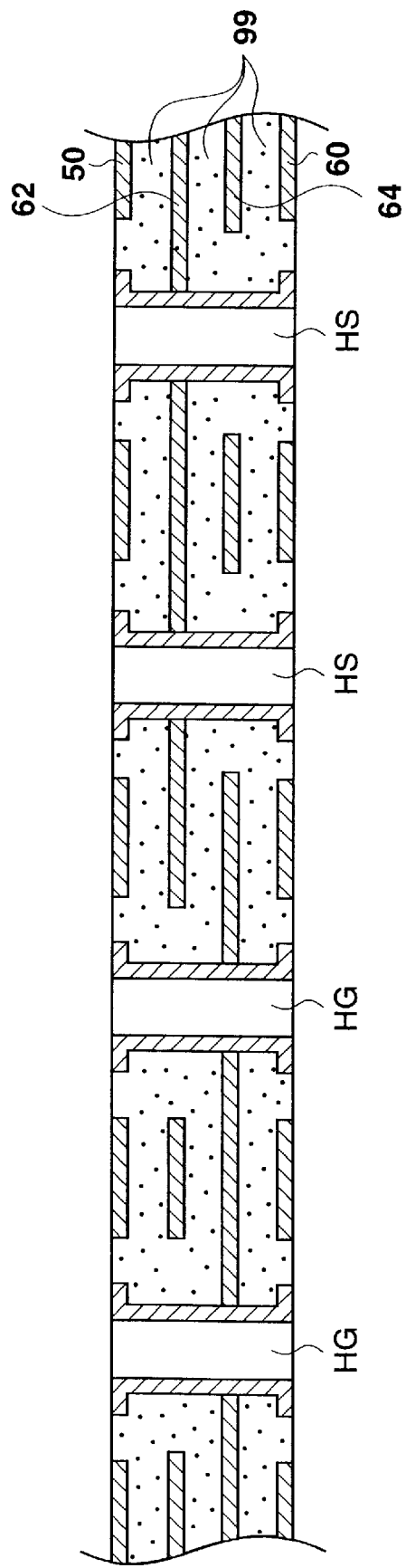
FIG. 4 is a diagram showing a through hole structure of the present invention.

FIG. 4 is a cross-sectional view showing the structure of the circuit board P. The circuit board P has through holes HS for the power source layer, and through holes HG for the ground layer. The through holes HS for the power source layer are electrically connected to the power source layer 62, however, they are electrically perfectly insulated from the other layers of the first wiring pattern layer 50, the ground layer 64 and the second wiring patter layer 60 by an insulating layer 99.

The through holes HG are electrically connected to the ground layer 64, however, they are electrically perfectly insulated from the other layers of the first wiring pattern layer 50, the power source layer 62 and the second wiring pattern layer 60 by the insulating layer 99.

These through holes HS for the power source layer mainly supply power from the power source layer 62 to the pattern wiring in the programmable region 20 and the first wiring pattern layer 50, the ground layer 64 and the second wiring pattern layer 60 of the general-purpose region 10. Further, the through holes HG for the ground layer are used to enforce the grounding capacity of the ground layer 64.

With such a structure as described above, the effect of noises from the programmable digital electrical part 21 in the programmable region 20 on the analog general-purpose electrical part 11 in the general-purpose region can be suppressed as much as possible.

Figure 5:
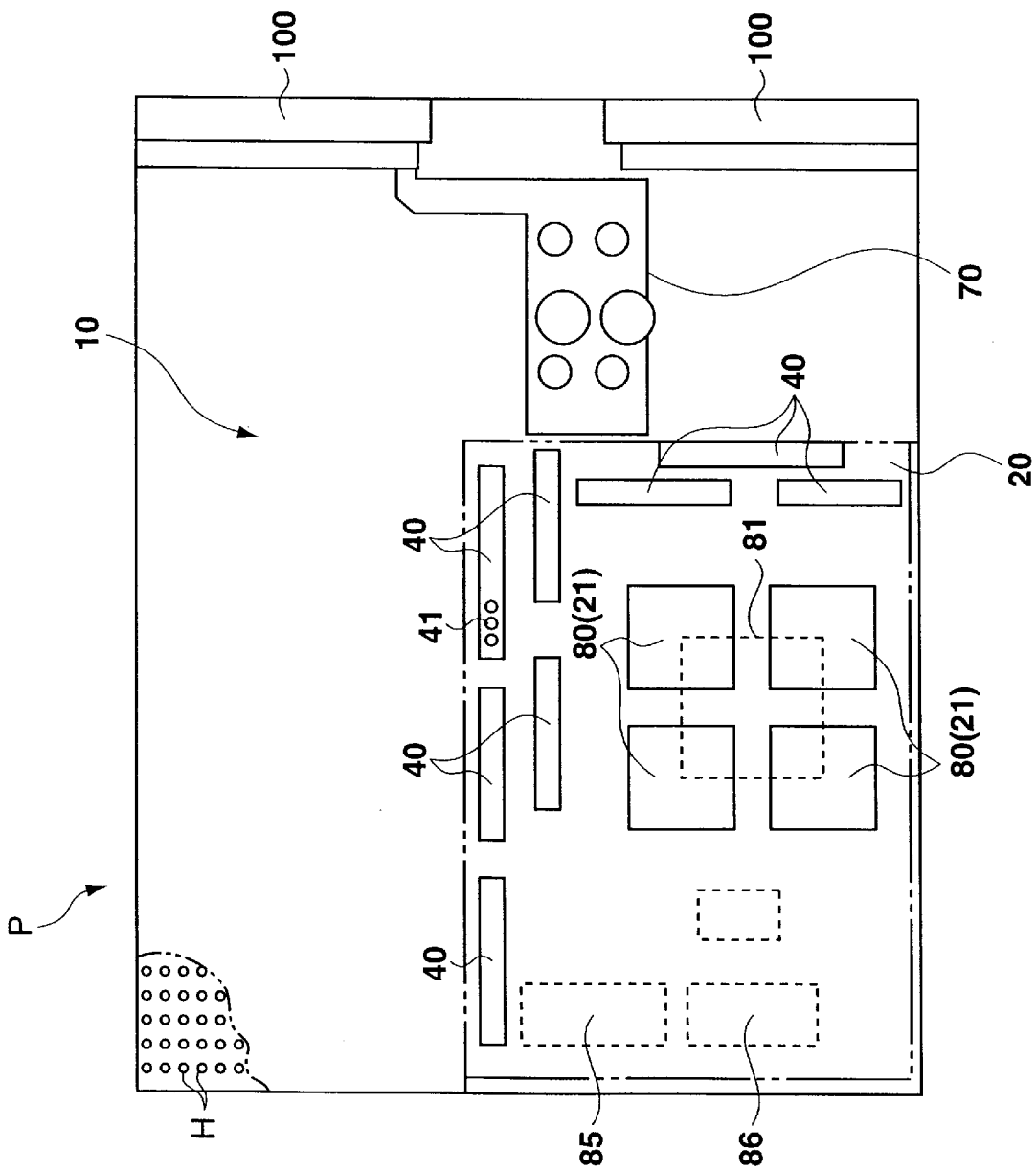
FIG. 5 is a diagram showing an arrangement at the obverse side of the circuit board of the present invention.
Figure 6:
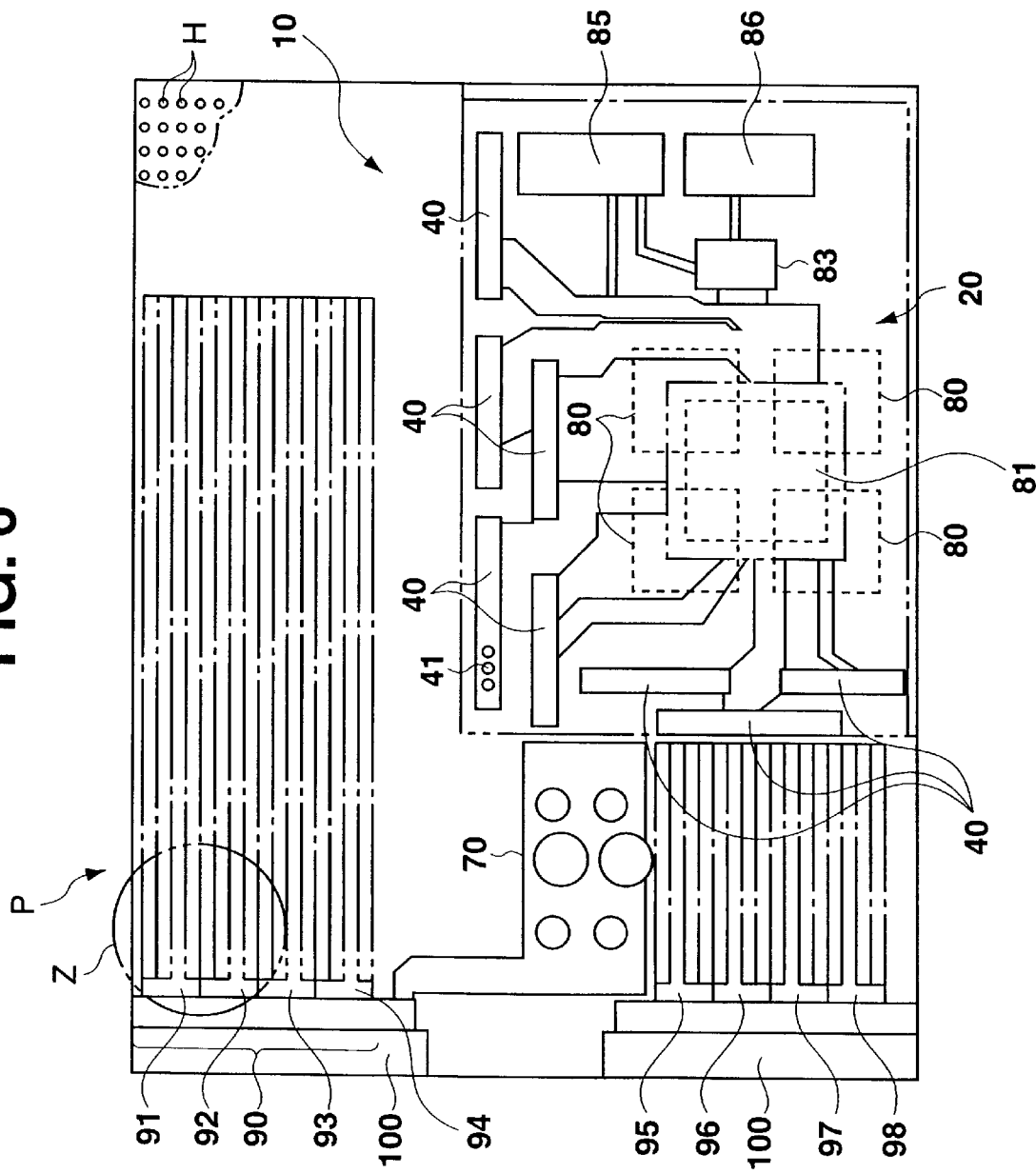
FIG. 6 is a diagram showing an arrangement at the back side of the circuit board.

FIGS. 5 and 6 are diagrams of an example of the circuit board P having electrical parts, which are viewed from the first wiring pattern layer 50 side and the second wiring pattern layer 60 side respectively.

In this case, as in the case of the circuit board shown in FIG. 1, the circuit board P has the general-purpose region 10, the digital circuit setting region 20, the connector 100, etc. In the general-purpose region 10 are provided a power source part setting region 70 for setting the parts for the power source circuit.

As shown in FIG. 5, for example, four programmable logic devices (PLD) 80 are mounted at the first wiring pattern layer 50 side of the programmable region 20. These programmable logic devices 80 are designed as highly integrated large-scale PLDs.

Further, as shown in FIG. 6, a switching device 81 is mounted at the second wiring pattern layer 60 side of the programmable region 20. The switching device 81 is a programmable IC for switching a wiring pattern between the four programmable logic devices 80 shown in FIG. 5 by software, and it can be freely set by a user.

The switching device 81 is disposed substantially at the center portion of the four devices 80.

Figure 7:
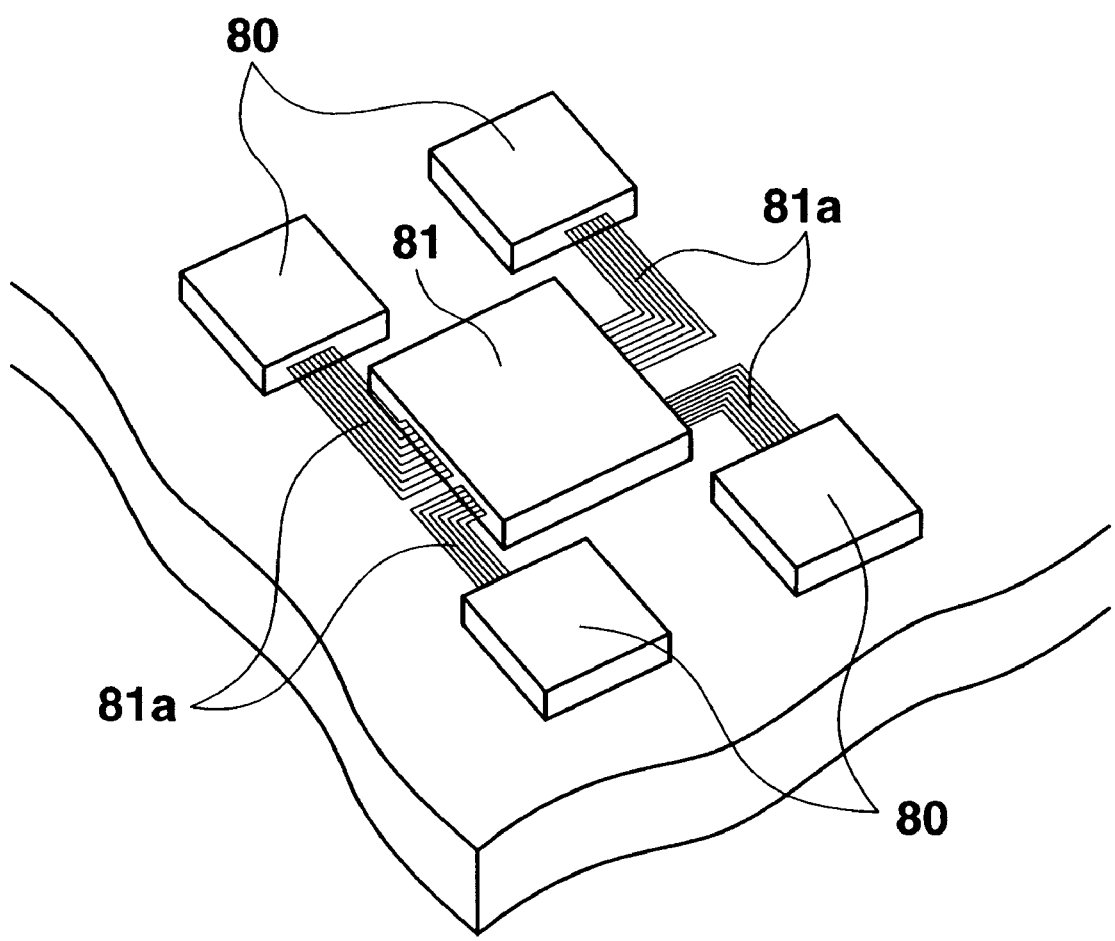
FIG. 7 is a diagram showing an arrangement of electric parts of a conventional board.
Figure 8:
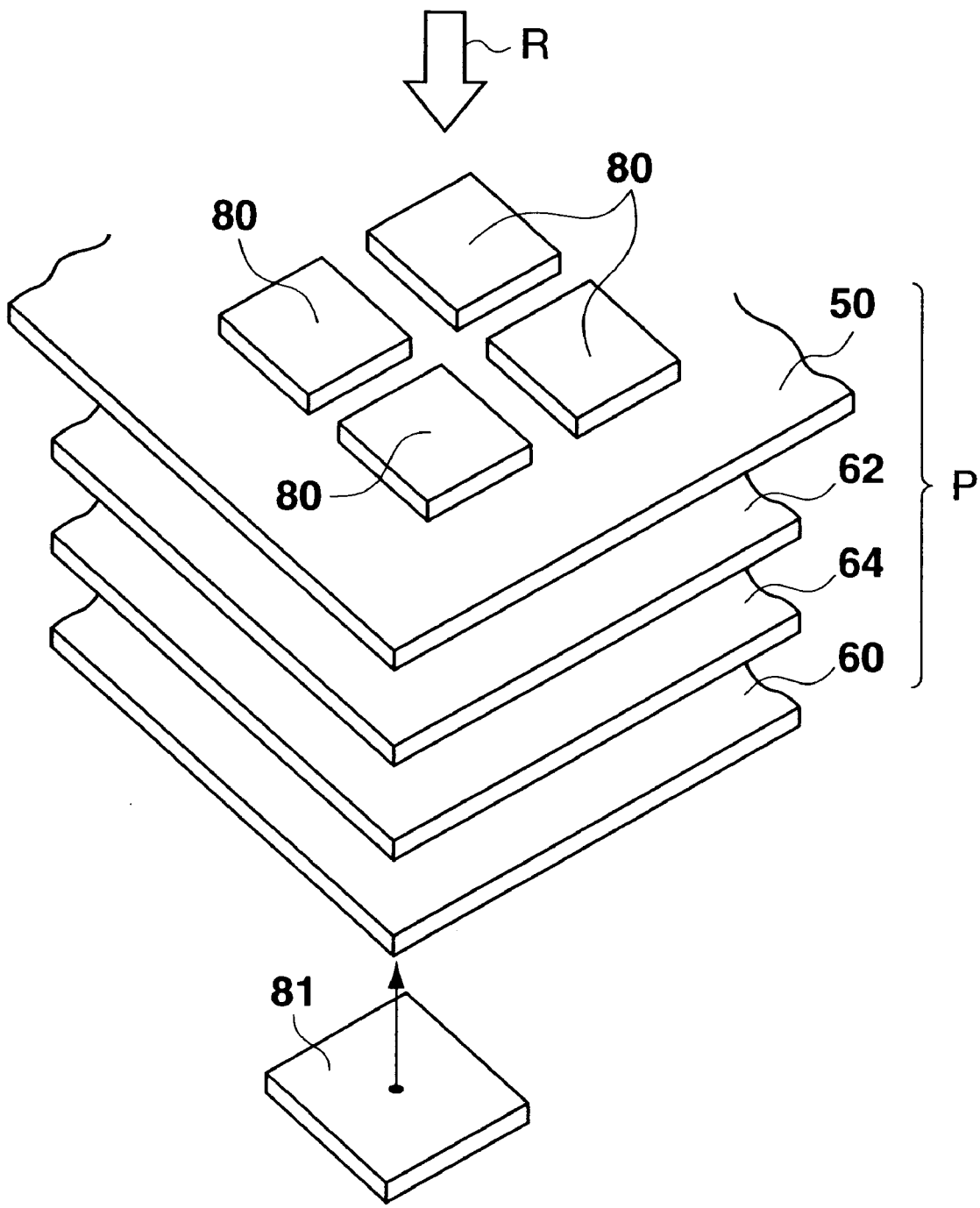
FIG. 8 is a diagram showing an arrangement of electric parts on the board of the present invention.
Figure 9:
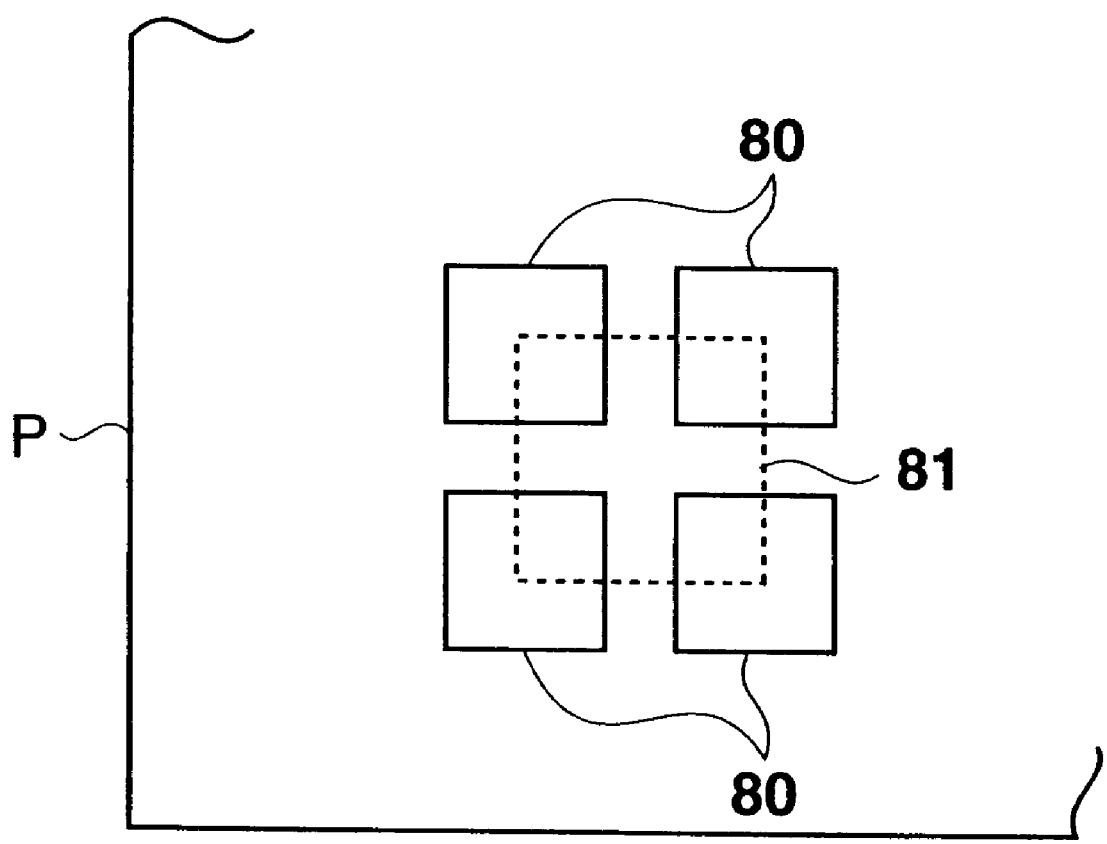
FIG. 9 is a plan view of the arrangement of the electric parts of FIG. 8, which is taken from the arrow R.

When the four devices 80 and the switching device 81 are disposed on the same board as in the case of the prior art, the wiring pattern 81a must be designed to be long as shown in FIG. 7. Here, the positional relationship between the devices 80 and the switching device 81 according to this embodiment is shown in FIGS. 8 and 9.

According to this embodiment, the switching device 81 is disposed at the position corresponding to the substantially center position of the four programmable logic devices 80, so that the electrical connection length between the switching device 81 and the programmable logic devices 80 can be shortened.

In FIG. 5, plural through hole assemblies 40 are provided in the programmable region 20 of the circuit board P, and each of these through hole assemblies 40 has many through holes 41.

Figure 10:
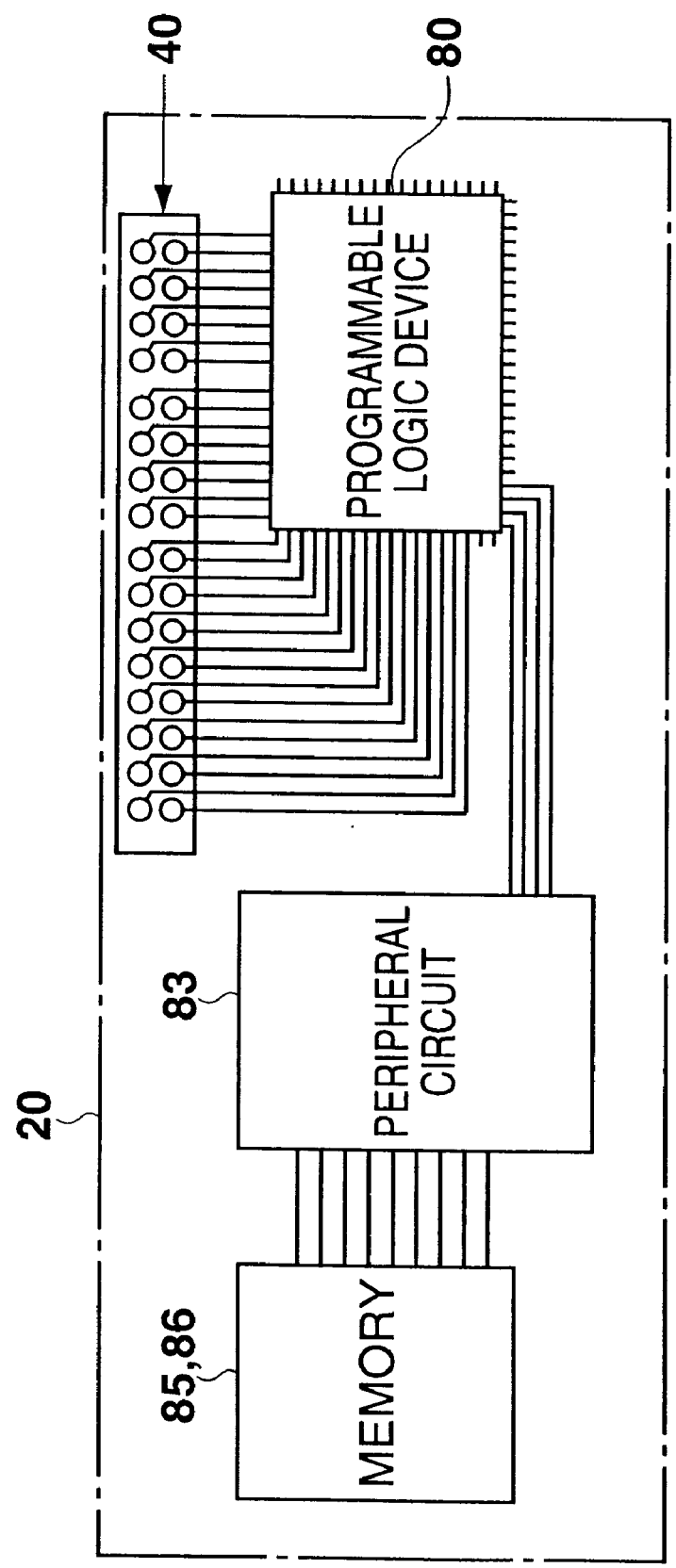
FIG. 10 is a diagram showing an arrangement of digital electric parts in a digital circuit setting region.

In FIG. 6, the programmable region 20 has a peripheral circuit 83 and memories 85 and 86. FIG. 10 shows a connection arrangement of the memories 85 and 86, the peripheral circuit 83, the programmable logic device 80 and the through hole group 40. The memory 85 is a memory for outputting an instruction to switch a connection system between the respective programmable logic devices 80, and the memory 86 is used to store data which are developed by a developing tool and then supplying the stored data to each of the programmable logic devices 80.

The peripheral circuit 83 serves to transmit programming data in the programmable logic devices 80 from the memory 86 to the programmable logic devices 80 at the power-on time or at a predetermined timing, and also serves to transmit programming data in the switching device 81 from the memory 85 to the switching device 81. On the basis of the transmission of these programming data, the operation of the corresponding circuit is performed by the programmable logic devices 80 and the switching device 81.

In this embodiment, the memories 85 and 86 are mounted in the digital circuit setting region 20. However, in place of the memories, an external memory, for example, a memory of a computer may be used. In this case, no memory is mounted in the programmable region 20, however, the programmable data may be directly transmitted through an interface from the outside of the circuit board P to the programmable logic devices 80 and the switching device 81.

The programmable logic devices 80 are preferably designed as a surface-mount type.

In the case where there is used a package which can directly mounted on an universal board, such as a pin grid array (PGA), if a programmable logic device being used is a large-scale programmable logic device having pins whose number exceeds 200, it would be difficult to insert a bypass capacitor proximately to and between a power source pin and a ground pin. Therefore, pin grid array type programmable logic device can remove less efficiently the noises on the power source pin as compared with the surface-amount type PLD. In addition, the pin interval of the PGA type is set to 0.1 inch, and thus if an I/O line (input/output line) is led from a pin inside the PLD to the outside of the PLD, the input/output line must be passed through a gap between pins in the course of the leading of the I/O line. Therefore, there may be a case where no signal can be transmitted from the inside pin because of limitation of the maximum number of pins which can be passed through the gap between pins. Accordingly, the surface-mount type IC is preferable used as the programmable logic device (PLD) 80.

Next, the general-purpose region 10 will be described.

In FIG. 5, many through holes H are formed at predetermined intervals in a grid form at the first wiring pattern layer 50 side of the general-purpose region 10 as described above. Likewise, through holes E are formed at predetermined intervals at the second wiring pattern layer 60 side of the general-purpose circuit setting region 10 shown in FIG. 6 so as to be coincident with the through holes H of FIG. 6.

As shown in FIG. 6, a wiring pattern 90 is provided at the second wiring pattern layer 60 side of the general-purpose region 10, and the wiring pattern 90 has preliminary power source patterns 91 to 98 as shown in FIG. 6.

These preliminary power source patterns 91 to 98 may be provided on any one of the first wiring pattern layer 50 and the second wiring pattern layer 60 of the general-purpose region 10, and in this embodiment it is provided at the second wiring pattern layer 60 side. If the power source layer 62 is assumed as a first power supply pattern, these preliminary power source patterns 91 to 98 correspond to a second power supply pattern.

FIG. 11 is an enlarged view of a portion Z of the wiring pattern 90. The wiring pattern 90 has the preliminary power source patterns 91 and 92, etc., and also has the through holes HS for the power source layer, the through holes HG for the ground layer, etc. Further, through holes HH which are not electrically connected to the power source layer 62 and the ground layer 64 are formed along the preliminary power source pattern 91.

The through holes HH are disposed at a first interval PT1 in a first direction D1. PT1 is set to 0.1 inch, for example.

Here, every two through holes HS for the power source and every two through holes HG for the ground layer are alternately formed along the preliminary power source patterns 91, 92, . . . 98.

Each of the preliminary power source patterns 91 to 98 electrically continuously connect through holes HR which are electrically insulated from both the power source layer 62 and the ground layer 64. The preliminary power source patterns 91 to 98 are parallel and repetitively disposed at a second interval PT2 in a second direction D2 perpendicular to the first direction D1. The array of the ground layer through holes HG and the power source layer through holes HS which are disposed along the preliminary power source patterns 91 is represented by L1, the array of the ground layer through holes HG and the power source layer through holes HS which are disposed along the adjacent preliminary power source patterns 92 is represented by L2, and the interval between the array L1 and the array L2 is represented by a third interval PT3. Here, PT3 is set to 0.6 inch, for example. The second interval PT2 is set to be equal to or more than the third interval PT3.

Figures 11A, 11B:
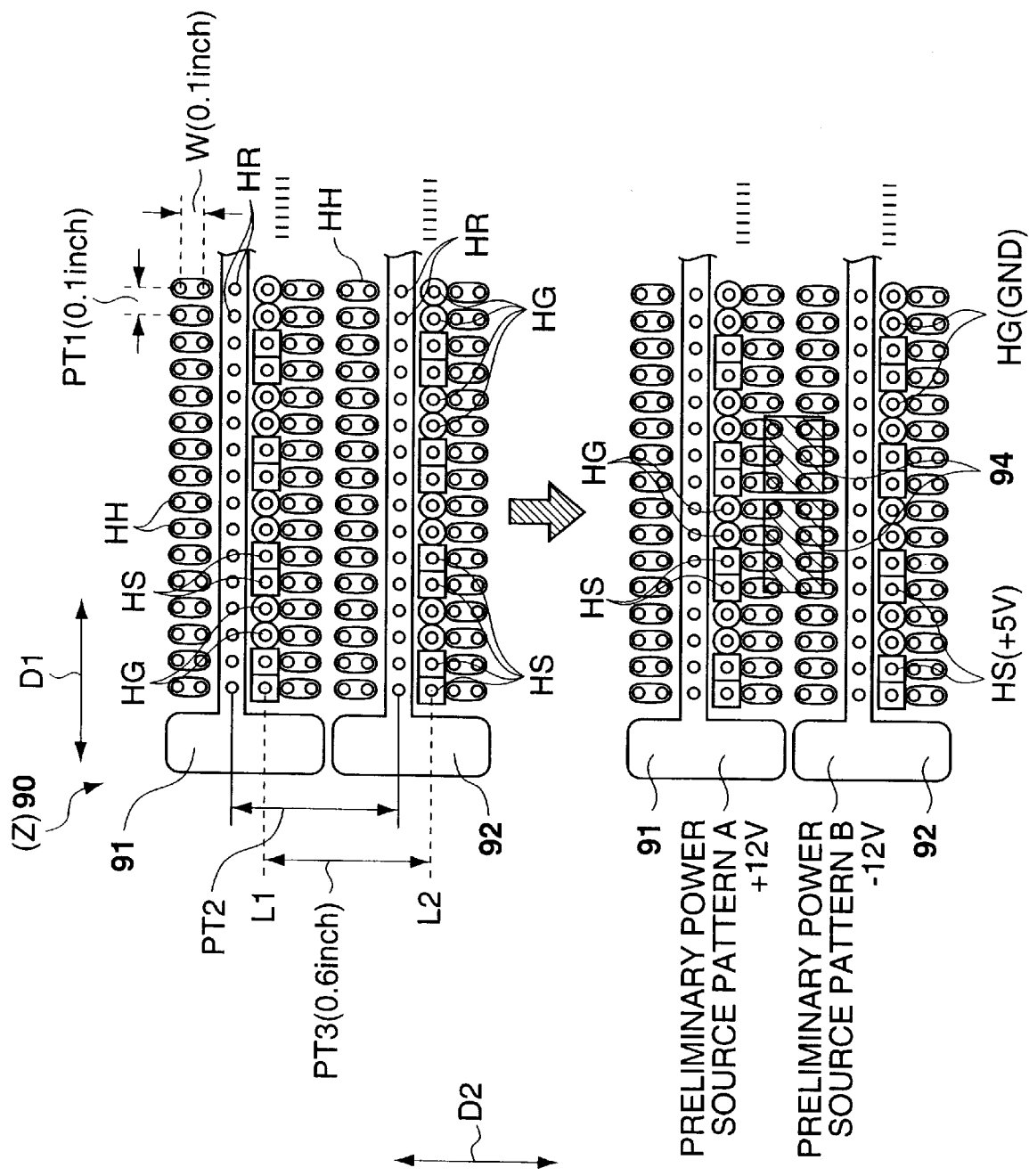
FIGS. 11A and 11B are diagrams showing a wiring pattern in a general-purpose region.

FIG. 11B shows a case where an 8-pin type DIP (dual in-line package) IC 94 is mounted. Every two power source layer through holes HS and every two ground layer through holes HG are alternately disposed on L1, so that the IC 94 can be easily connected to the ground layer 64 and the power source layer 62 through the through holes HG and the through holes HS.

In the case of FIG. 11B, for example, when the preliminary power source pattern 91 is set to +12V, the preliminary power source pattern 92 is set to −12V and the power source for the inner layers is set to +5V, three power sources +12V, −12V and +5V are obtained just near to the IC 94, and the ground layer 64 of the inner layer is disposed just near to the IC 94, so that a circuit having high resistance to noises or excellent performance can be formed.

As described above, according to the present invention, the general-purpose region 10 and the programmable region 20 are formed on the same board P. Accordingly, the circuit board P is usable as a general-purpose circuit on which both a general-purpose electrical part and a programmable digital electric part can be mounted.

For example, the switching device can be disposed for the plural programmable logic devices, and thus the wiring length of each of these devices can be shortened as much as possible.

Further, if a digital electrical part to be mounted in the programmable region is a surface-mount type part, the connection between the digital electrical part and an external part can be easily performed.

Since the through hole assembly 40 serving as interface means for electrically connecting the general-purpose region and the programmable region is disposed at the boundary area between these regions, the electrical connection between these regions can be easily performed. Accordingly, the wiring between boards which has been hitherto required is not needed, and thus the number of pins for interface with the external can be reduced.

The power source layer and the ground layer are laminated between the first wiring pattern layer and the second wiring pattern layer, so that the effect of noises at the programmable region side on the general-purpose region side can be suppressed as much as possible.

The through holes which are electrically connected to the power source layer and the through holes which are electrically connected to the ground layer are alternately disposed, for example, two by two, so that the connection of electrical parts in the general-purpose region can be facilitated. Further, when a DIP type IC is mounted, it can be supplied with power from the three power sources which are proximate to the IC as described above. Accordingly, it can be designed to have very high resistance to noises.

In the above embodiment, every two through holes for the power source and every two through holes for the ground layer are alternately and repetitively arranged. However, these through holes may be alternately arranged one by one. In consideration of the mounting of the 8-pin type DIP, it is preferable that these through holes are alternately and repetitively arranged two by two or one by one.

Further, the circuit board P of the above embodiment is designed to have the four-layered laminate structure. However, the circuit board P of the present invention is not limited to the above structure, and it may be designed to have a laminate structure of four or more layers to further reduce noises. That is, a multilayer structure makes it possible to increase the number of ground layers (i.e., increase the total area of the ground layer), thereby gaining a more electrically stable ground.

Still further, the multilayer structure increases the number of wiring pattern layers, so that the integration of wiring patterns is also increased and thus the circuit board can be further miniaturized.

What is claimed is:

1. A circuit board, comprising:
    a general purpose region in which a general-purpose electrical part is mounted; and
    a programmable region in which a programmable digital electrical part is mounted, said general-purpose region and said programmable region being provided on the same board, wherein
    an interface means for electrically connecting said programmable region and said general-purpose region is disposed at the boundary area between said programmable region and said general-purpose region.

2. The circuit board as claimed in claim 1, wherein a programmable digital part which is set up in said programmable region is of a surface-mount type.

3. The circuit board as claimed in claim 1, wherein plural programmable electrical parts are mounted in a first wiring pattern layer, and a switching device is mounted in a second wiring pattern layer, said switching device being located so as to be electrically connected to said plural programmable electrical parts at the shortest distance.

4. A circuit board, comprising: a general-purpose region in which a general-purpose electrical part is mounted;
    a programmable region in which a programmable digital electrical part is mounted, said general-purpose region and said programmable region being provided on the same board;
    said circuit board comprising at least four layers of:
        a first wiring pattern layer;
        a second wiring pattern layer;
        a power source layer provided between said first and second wiring pattern layers; and
        a ground layer provided between said first and second wiring pattern layer;
        wherein through holes are formed at a first interval in a first direction in a matrix form in said general-purpose region, and said through holes contain through holes for a power source which are electrically connected to said power source layer, through holes for ground which are electrically connected to said ground layer, and through holes which are connected to neither said power source layer nor said ground layer; and,
        a second power supply pattern is provided in said general-purpose region of any one of said first wiring pattern layer and said second wiring pattern layer, said second power supply pattern being designed to continuously and electrically connect plural through holes which are electrically insulated from both of said power source layer and said ground layer.

5. The circuit board as claimed in claim 4, wherein said second power supply pattern is repetitively disposed at a second interval in a second direction.

6. The circuit board as claimed in claim 4, wherein said power source through holes and said ground through holes are arranged along said second power supply pattern, and arranged along the second direction at every third interval which is above the second interval.

* * * * *